United States Patent
Shinoda et al.

(10) Patent No.: US 8,674,349 B2
(45) Date of Patent: Mar. 18, 2014

(54) RESIN FILM FORMING SHEET FOR CHIP, AND METHOD FOR MANUFACTURING SEMICONDUCTOR CHIP

(75) Inventors: Tomonori Shinoda, Saitama (JP); Yoji Wakayama, Saitama (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 13/638,113

(22) PCT Filed: Mar. 30, 2011

(86) PCT No.: PCT/JP2011/057969
§ 371 (c)(1),
(2), (4) Date: Sep. 28, 2012

(87) PCT Pub. No.: WO2011/125711
PCT Pub. Date: Oct. 13, 2011

(65) Prior Publication Data
US 2013/0011998 A1  Jan. 10, 2013

(30) Foreign Application Priority Data
Mar. 31, 2010  (JP) ................................. 2010-083690

(51) Int. Cl.
*H01L 29/08* (2006.01)
(52) U.S. Cl.
USPC ...................... 257/40; 257/763; 257/E21.499
(58) Field of Classification Search
None
See application file for complete search history.

(56) References Cited

U.S. PATENT DOCUMENTS

| | | |
|---|---|---|
| 7,485,547 B2 | 2/2009 | Yamamura et al. |
| 7,682,895 B2 | 3/2010 | Oyu |
| 2008/0260982 A1 | 10/2008 | Senoo et al. |

FOREIGN PATENT DOCUMENTS

| | | |
|---|---|---|
| JP | 2002280329 A | 9/2002 |
| JP | 2005277116 A | 10/2005 |
| JP | 2005322738 A | 11/2005 |
| JP | 2006249415 A | 9/2006 |
| JP | 2007242713 A | 9/2007 |

OTHER PUBLICATIONS

English abstract of JP2005277116 (A).
English abstract of JP2007242713 (A).
English abstract of JP2002280329 (A).
English abstract of JP200624915 (A).
English abstract of JP2005322738 (A).
International application No. PCT/JP2011/057969, Notification of Transmittal of Translation of the International Preliminary Report on Patentability, dated Nov. 22, 2012. English translation.
English abstract of JP2006249415 (A) dated Sep. 21, 2006.

*Primary Examiner* — Cheung Lee
(74) *Attorney, Agent, or Firm* — Cahn & Samules, LLP

(57) ABSTRACT

A sheet for forming a resin film for a chip, with which a semiconductor device is provided with a gettering function, is obtained without performing special treatment to a semiconductor wafer and the chip. The sheet has a release sheet, and a resin film-forming layer, which is formed on the releasing face of the release sheet, and the resin film-forming layer contains a binder polymer component, a curing component, and a gettering agent.

10 Claims, No Drawings

RESIN FILM FORMING SHEET FOR CHIP, AND METHOD FOR MANUFACTURING SEMICONDUCTOR CHIP

This application is a U.S. national stage application of PCT/JP2011/057969 filed on Mar. 30, 2011 which claims priority of Japanese patent document 2010-083690 filed on Mar. 31, 2010, the entireties of which are incorporated herein by reference.

TECHNICAL FIELD

The present invention relates to a resin film forming sheet for chip capable of forming the resin film having a gettering effect efficiently on a back side of a semiconductor wafer, and also capable of improving the production efficiency of the chip. Particularly, the present invention relates to the resin film forming sheet for chip used for the production of the semiconductor chip mounted by the so called face down method. Also, the present invention relates to a production method of the semiconductor chip using above mentioned resin film forming sheet for chip.

BACKGROUND OF THE INVENTION

Recently, due to the demand of making the element compact, the semiconductor chip is demanded to be thinner. The semiconductor chip is ground to the predetermined thickness by the back side grinding after the circuit is formed on the front surface. Therefore, in order to make the element compact, the wafer must be ground further thinner by the back side grinding. However, along with the thickness of the wafer becomes thinner, the wafer strength declines, and the wafer may break even by a small impact. As a cause of the wafer break, "a fractured layer" is thought to be the main cause which is the mixture of the grinding scars of the grinder used during the back side grinding or an oxidized layer or so.

The fractured layer is a minute roughness of the wafer surface which has been ground, and it is under the condition that a polycrystalline of silicon or a silicon which has been oxidized by small amount of the oxygen, further the lattice defect are thought to be included. Due to the stress caused by the roughness or the compositional changes of the surface, a crack may occur even by a small impact and cause the wafer break. Thus, after the back side grinding is completed, in order to remove the fractured layer, it has been generalized to carry out the chemical etching or plasma etching or so to the back side. By removing the fractured layers, the wafer strength is improved, and a good handling property is maintained even for the wafer which has been ground extremely thin.

However, by removing the fractured layer, the deterioration of the contamination resistance property of the obtained wafer or chip against metals is concerned.

The semiconductor wafer contacts with various members when forming the circuit or during the back side grinding and the mounting or so. At this time, a metal such as copper or so is released from these other members, and the wafer may be contaminated by the metals. The metal impurities accumulates in the wafer, and it may be ionized under the heat applying condition such as reflow or so and may move inside the wafer. Then, the metal which has reached the circuit surface interfere the electrical operation of the product and causes a malfunction. Also, metal ion which has reached the circuit surface may generate a metal at the circuit face (these may be called as migration). Particularly, when the metal is generated on the semiconductor wafer surface in which the wiring is very minute, the short circuit may happen on the circuit, and the yield of the product may decline.

On the other hand, as described in the above, the fractured layer is a minute roughness and it is under the condition that a polycrystalline of silicon or silicon which has been oxidized by small amount of the oxygen, and further the lattice defect are thought to be included, thus due to these composition and the unevenness of the structures, said metal impurities are easily captured, thereby it is thought that the influence of the metal impurities may be reduced. The function of such fractured layer is also called as the gettering function.

As such, by removing the fractured layer after the back side grinding of the wafer, the strength of the wafer may be improved however the gettering function is interfered, and the product yield declines. Thus, the techniques is proposed to provide a gettering function by carrying out a various treatment to the semiconductor wafer or chip after the removal of the fractured layer (Patent Articles 1 and 2).

PRIOR ART

[Patent Article 1] Japanese Patent application Laid Open Publication No. 2005-277116
[Patent Article 2] Japanese Patent application Laid Open Publication No. 2007-242713

SUMMARY OF THE INVENTION

However, by carrying out the treatment to provide the gettering function to the semiconductor wafer or chip as described in the patent articles 1 and 2 results in the increase of the production steps, and complicates process and the increases of the cost.

The present invention has been achieved by reflecting the above situation, and the object is to provide the gettering function to the obtained semiconductor device without carrying out the treatment to the semiconductor wafer or the chips which increases the steps, and complicates the process.

The present inventors have found as a result of keen examination to solve the above described objects, by providing the gettering function to the resin film formed on the back side of the semiconductor chip, the gettering site can be introduced into the semiconductor device thereby the present invention was achieved.

The present invention includes the following points.

(1) A resin film forming sheet for chip comprising a release sheet and a resin film forming layer formed on a releasing face of said release sheet, and said resin film forming layer includes a binder polymer component (A), a curable component (B) and a gettering agent (C).

(2) The resin film forming sheet for chip as set forth in (1) wherein the gettering agent (C) is selected from a group consisting of a heavy metal inactivator (C1), a organic chelate agent (C2) and a copper ion capture metal compound (C3).

(3) The resin film forming sheet for chip as set forth in (1) or (2) wherein a copper ion absorbing ability of the gettering agent (C) as defined in below is 30% or more:

introducing 1 g of the gettering agent into 50 g of copper chloride solution having a copper ion concentration of 3 ppm, then measuring the copper ion concentration of said copper ion solution after being left for 24 hours under 2 atmospheric pressure at 121° C. to obtain the copper ion absorbing ability by, copper ion absorbing ability=(3 ppm−remaining copper ion concentration (ppm))×100/3 ppm.

(4) The resin film forming sheet for chip as set forth in any one of (1) to (3), wherein said resin film forming layer further includes a coloring agent (D).

(5) The resin film forming sheet for chip as set forth in any one of (1) to (4), wherein 1 to 35 parts by weight of the gettering agent (C) is included per 100 parts by weight of an entire solid portion constituting the resin film forming layer.

(6) The resin film forming sheet for chip as set forth in any one of (1) to (5), wherein the resin film forming layer is a protection film for a semiconductor wafer or chip.

(7) A production method of a semiconductor chip characterized by obtaining a semiconductor chip comprising a resin film on a back side by adhering a resin film forming layer of the resin film forming sheet for chip as set forth in any one of (1) to (6) to the back side of a semiconductor wafer formed with a circuit on a front surface.

(8) The production method of the semiconductor chip as set forth in (7) including following steps (1) to (3), and the steps (1) to (3) are carried out in an arbitrary order:

Step (1): releasing a resin film forming layer and a release sheet

Step (2): curing the resin film forming layer

Step (3): dicing the semiconductor wafer and the resin film forming layer.

(9) The production method of the semiconductor chip as set forth in (7) or (8), wherein the semiconductor wafer is the wafer having a fractured layer caused by the back side grinding being reduced to the thickness of 50 nm or less.

(10) The production method of the semiconductor chip as set forth in any one of (7) to (9), wherein the resin film is a protection film of the semiconductor chip.

When forming the resin film on the back side of the semiconductor chip, by using the resin film forming sheet for chip according to the present invention, the gettering site can be introduced into the obtained semiconductor device without carrying out a special treatment to the semiconductor wafer or the chip.

DETAILED DESCRIPTION OF THE INVENTION

Hereinafter, the present invention will be further specifically explained including the best mode for carrying out the invention. The resin film forming sheet for chip according to the present invention comprises a release sheet, a resin film forming layer formed on a releasing face of the release sheet.

(The Resin Film Forming Layer)

The resin film forming layer includes a binder polymer component (A), a curable component (B), and a gettering agent (C).

(A) The Binder Polymer Component

The binder polymer component (A) is used to provide a sufficient bonding property and a film forming property (a sheet process property) to the resin film forming layer. As for the binder polymer component (A), conventionally known acrylic polymer, polyester resin, urethane resin, acrylic urethane resin, silicone resin, rubber polymer or so can be used.

The weight average molecular weight (Mw) of the binder polymer component (A) is preferably 10000 to 2000000, and more preferably 100000 to 1500000. If the weight average molecular weight of the binder polymer component (A) is too low, the releasing force between the resin film forming layer and the release sheet is increased, and it may cause a transfer failure of the resin film forming layer. On the other hand, if it is too high, the bonding property of the resin film forming layer declines and the chip or so may not be transferred or the resin film or so may be released from the chip or so after the transferring.

As for the binder polymer component (A), an acrylic polymer is preferably used. The glass transition temperature (Tg) of the acrylic polymer is preferably within the range of −60 to 50° C., more preferably −50 to 40° C., and particularly preferably −40 to 30° C. If the glass transition temperature of the acrylic polymer is too low, the releasing force between the resin film forming layer and the release sheet becomes large, and it may cause a transfer failure of the resin film forming layer. On the other if it is too high, the bonding property of the resin film forming property declines and the chip or so may not be transferred or the resin film or so may be released from the chip or so after the transferring.

As for a monomer constituting the above mentioned acrylic polymer, (meth)acrylate monomer or the derivatives thereof may be mentioned. For example, alkyl(meth)acrylate having 1 to 18 carbon atoms of the alkyl group such as methyl(meth)acrylate, ethyl(meth)acrylate, propyl(meth)acrylate, butyl(meth)acrylate, 2-ehylhexyl(meth)acrylate or so may be mentioned; (meth)acrylate having cyclic structure such as cycloalkyl(meth)acrylate, benzyl(meth)acrylate, isobornyl(meth)acrylate, dicyclopentanyl(meth)acrylate, dicyclopentenyl(meth)acrylate, dicyclopentenyloxyethyl(meth)acrylate, imide(meth)acrylate or so may be mentioned; hydroxymethyl(meth) acrylate, 2-hydroxyethyl(meth)acrylate, 2-hydroxypropyl(meth)acrylate or so which comprises hydroxyl group may be mentioned; and other than that glycidyl(meth)acrylate or so which comprises epoxy group may be mentioned. Among these, the acrylic polymer obtained by polymerizing the monomer having hydroxyl group is preferable as it has good compatibility with the curable component (B) which will be described in below. Also, the above mentioned acrylic polymer may be copolymerized with acrylic acid, methacrylic acid, itaconic acid, vinyl acetate, acrylonitrile, styrene or so.

(B) The Curable Component

As the curable component (B), the heat curable component and the heat curing agent are used. As for the heat curing component, for example epoxy resin is preferable.

As for the epoxy resin, conventionally known epoxy resin can be used. As for the epoxy resin, specifically, epoxy resin having two or more of functional group in the molecule such as polyfunctional epoxy resin, biphenyl compound, a bisphenol A diglycidyl ether or the hydrogenates thereof, orthocresol novolac epoxy resin, dicyclopentadiene epoxy resin, biphenyl epoxy resin, bisphenol A epoxy resin, bisphenol F epoxy resin, phenylene structure epoxy resin or so may be mentioned. These may be used alone or by mixing two or more thereof.

At the resin film forming layer, the heat curing component is included preferably by 1 to 1500 parts by weight, and more preferably 3 to 1200 parts by weight with respect to 100 parts by weight of binder polymer component (A). If the content of the heat curable component is less than 1 parts by weight, a sufficient bonding property may not be obtained, and if the it exceeds 1500 parts by weight, then the releasing force between the resin film forming layer and the release sheet becomes high; thereby the transfer failure of the resin film forming layer may happen.

The heat curing agent functions as curing agent against the heat curable component particularly of epoxy resin. As the preferable heat curing agent, the compound having tow or more functional group in one molecule capable of reacting with the epoxy group may be mentioned. As for such functional group, phenolic hydroxyl group, alcoholic hydroxyl group, amino group, carboxyl group and acid anhydrides or so may be mentioned. Among these, preferably phenolic hydroxyl group, amino group, and acid unhydride or so may be mentioned; and further preferably phenolic hydroxyl group and amino group may be mentioned. Further, preferably phenolic hydroxyl group and amino group may be mentioned.

As for the specific examples of the phenolic curing agent, polyfunctional phenol resin, biphenol, novolac phenol resin, dicyclopentadiene phenol resin, XYLOK phenol resin, aralkyl phenol resin or so may be mentioned. As for specific examples of amine curing agent, DICY (dicyandiamide) may be mentioned. These may be used alone or by mixing two or more thereof.

The content of the heat curing agent is preferably 0.1 to 500 parts by weight, and more preferably 1 to 200 parts by weight with respect to 100 parts by weight of the heat curing component. If the content of the heat curing agent is too little, the bonding property may not be obtained due to the insufficient curing, on the other hand if it is too much, then the moisture absorbing rate of the resin film forming layer increases and lowers the reliability of the semiconductor device.

(C) The Gettering Agent

The gettering agent (C) is not particularly limited as long as it has a function to capture the metal ion such as copper ion or so; however it is used by selecting at least one from a group consisting preferably of a heavy metal inactivator (C1), an organic chelate agent (C2) and a copper ion capture metal compound (C3). By belnding the gettering agent (C) into the resin film forming layer, the gettering function is provided to the resin film forming layer, and the gettering site is introduced in the semiconductor device.

(C1) The Heavy Metal Inactivator

The heavy metal inactivator is an additive blended in a small amount to various plastics in order to prevent the plastic deterioration due to the metal such as catalyst residue or so. The heavy metal inactivator is thought to prevent the plastic deterioration by capturing the metal component and reducing the effect thereof. As for such heavy metal inactivator, various inactivator of an inorganic type or an organic type are known, however the organic heavy metal inactivator is preferably used in the present invention. The organic heavy metal inactivator has superior dispersibility in the resin film forming layer.

As for such heavy metal inactivator, the compound having a following structure in the part of the molecule is particularly preferably used.

[Chemical formula 1]

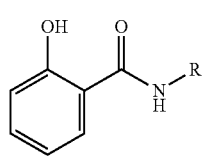

In the above formula, R is a hydrocarbon structure which may comprise hydrogen or hetero atom; and it is preferably a hydrocarbon structure comprising nitrogen atom and/or oxygen atom.

As the particularly preferable example of such heavy metal inactivator, the following compound may be mentioned.

3-(N-salicyloyl)amino-1,2,4-triazol (CDA-1, made by ADEKA Corporation, CAS No. 36411-52-6)

[Chemical formula 2]

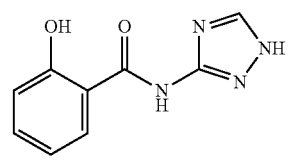

Decamethylenedicarboxydisalicyloylhydrazide (CDA-6, made by ADEKA Corporation, CAS No. 63245-38-5)

[Chemical formula 3]

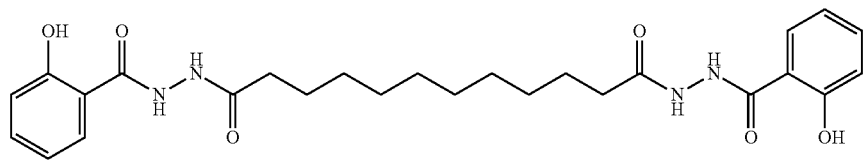

(C2) The Organic Chelate Agent

The organic chelate agent (C2) is not particularly limited; however it comprises a polyvalent carboxylic acid as the functional group, and the acid value thereof is preferably 100 to 600 mg/g, and more preferably 260 to 330 mg/g. When the acid value of the organic chelate agent (C2) is smaller than 100 mg/g, then the gettering function of the object is insufficient; on the other hand when it is larger than 600 mg/g, then it may interact with basic heat curing agent.

Also, the mass decline strating temperature by a differential scanning calorimetry (TG/DTA) of the organic chelate agent (C2) is preferably 190° C. or higher, and more preferably 196° C. or higher. If the weight deline starting temperature of the differential scanning calorimetry (TG/DTA) of the organic chelate agent (C2) is lower than 190° C., IR reflow resistance property of the semiconductor device may decline.

(C3) The Copper Ion Capture Metal Compound

The copper ion capture metal compound (C3) has an effect to capture the copper ion. For example, an oxide, a hydroxide, a nitrate or a carbonate of antimony, bismuth, magnesium, aluminum or so may be mentioned. These are preferable since the effect can be obtained even by small amount. As the example thereof, preferably antimony oxides, bismuth oxides, and the mixture thereof, and hydrotalcite which is an magnesium aluminum oxide and the fired product may be mentioned. Note that, Al in the hydrotalcite may be substituted with Cr or Fe.

As the gettering agent (C), the above mentioned can be used alone or by mixing two or more thereof. Also, the blending amount of the gettering agent (C) is preferably 1 to 35 parts by weight, more preferably 10 to 35 parts by weight, and particularly preferably 20 to 30 parts by weight with respect to 100 parts by weight of entire solid portion constituting the resin film forming layer. In case the blending amount of the gettering agent (C) is too little, the gettering function of the object becomes insufficient, and in case it is too much, then the bonding property may be interfered.

By blending such gettering agent (C) in the resin film of the semiconductor chip, the gettering cite can be introduced into the semiconductor device. Therefore, the metal impurities accumulated in the wafer is captured, under the heat applying condition such as the reflow or so, by the gettering agent (C) in the resin film even when it has moved; thus the migration will not happen on the circuit surface.

The gettering function of the gettering agent (C) can be evaluated by the following described copper ion absorbind ability.

That is, 1 g of the gettering agent is introduced into 50 g of a copper chloride aqueous solution having copper ion concentration of 3 ppm which is made by dissolving 0.805 g of copper (II) chloride dihydrate made by KANTO CHEMICAL CO., INC. in 1 L of ultra pure water and further diluting into 100-fold; then this aqueous solution was left for 24 hours under 2 atmospheric pressure at 121° C. and measured the copper ion concentration (the remaining copper ion concentration) of said copper ion solution. Then, the copper ion absorbing ability was evaluated from the following formula using the initial copper ion concentration (3 ppm) and the remaining copper ion concentration (ppm).

The copper ion absorbing ability=(3 ppm−the remaining copper ion concentration (ppm))×100/3 ppm The copper ion absorbing ability shows the ratio of the copper ion captured (absorbed or taken-up) by the gettering agent, and as the copper ion absorbing ability is high, the gettering function is thought to be high. The copper ion absorbing ability of the gettering agent (C) used in the present invention is preferably 30% or more, more preferably 50% or more, and particularly 95% or more.

Also, the gettering function can also be evaluated by the absorbed amount of the copper ion absorbed per unit weight of the gettering agent (hereinafter, it will be referred as "a copper ion absorbing rate"). Specifically, the gettering agent is introduced into the copper ion aqueous solution as described in the above, and the copper ion absorbing rate is obtained from the following formula.

The copper ion absorbing rate (%)=(3 ppm−the remaining copper ion concentration (ppm))×the solution amount (g)×10$^{-6}$×100/the sample weight (g)

The copper ion absorbing rate of the gettering agent (C) used in the present invention is preferably 0.003% or more, more preferably 0.01% ore more, and particularly preferably 0.013% or more.

The gettering agent (C) generally has broader surface area per weight as the particle diameter is small; thus it becomes easy to capture the metal impurities and increases the gettering function. Also, in general, as the particle diameter is small, the formation of the thick resin layer becomes easy. Therefore, the average particle diameter of the gettering agent (C) used in the present invention is preferably within the range of 1 nm to 30 μm, more preferably 5 nm to 10 μm, and particularly preferably 10 nm to 1 μm.

In case the particle diameter is large at the raw material level, it is pulverized by suitable method (ball mill, triple roll method or so) before or at the mixing with other components.

Note that, the average diameter of the gettering agent (C) is obtained from the arithmetic mean of 100 particles observed by the scanning electron microscope (SEM). When the shape of the particle was not sphere, the longest diameter was defined as the diameter.

(D) The Coloring Agent

The coloring agent (D) can be blended into the resin film forming layer. By blending the coloring agent, when the semiconductor device is incorporated into the machines, the malfunction of the semiconductor caused by the infrared ray or so generated from the surrounding devices can be prevented. As for the coloring agent, the pigments and dies of organic or inorganic type are used. Among these, a black pigment is preferable from the point of the blocking property of the electromagnetic wave or the infrared ray. As for the black pigment, carbon black, iron oxide, manganese dioxide, aniline black, and activated carbon or so may be used, but it is not limited thereto. The carbon black is particularly preferable from the point of improving the reliability of the semiconductor device. The blending amount of the coloring agent (D) is preferably 0.1 to 35 parts by weight, more preferably 0.5 to 25 parts by weight, and most preferably 1 to 15 parts by weight with respect to 100 parts by weight of entire solid portion constituting the resin film forming layer.

Other Components

The resin film forming layer can include below described components in addition to the above mentioned binder polymer (A), curable component (B), gettering agent (C) and coloring agent (D).

(E) A Heat-Curing Catalyst

The heat-curing catalyst (E) is used for control the curing speed of the resin film forming layer. The heat-curing catalyst (E) is preferably used in case the epoxy resin and the heat curing agent are used together in the curable component (B).

As for the preferable heat-curing catalyst, a tertiary amine such as triethylene diamine, benzyldimethyl amine, triethanol amine, dimethylamino ethanol, tris(dimethylaminomethyl)pheniol or so, imidazol such as 2-methylimidazol, 2-phenylimidazol, 2-phenyl-4-methylimidazol, 2-phenyl-4,5-dihydroxymethylimidazol, 2-phenyl-4-methyl-5-hydroxymethylimidazol or so; organic phosphine such as tributylphosphine, diphenylphosphine, triphenylpho sine or so; tetraphenylboron salt such as tetraphenylphosphoniumtetraohenylborate, triphenylphosphinetetraphenylborate or so may be mentioned. These may be used alone or by mixing two or more thereof.

The heat-curing catalyst (E) is included preferably within the range of preferably 0.01 to 10 parts by weight, more preferably 0.1 to 1 parts by weight, with respect to 100 parts by weight of curable component (B). By comprising the heat-curing catalyst in the amount described in above range, it has superior bonding characteristic even if it is exposed under the high temperature high humidified condition, and also even if it is exposed to a harsh reflow condition, a high reliability can be still attained. If the content of the heat-curing catalyst (E) is too little, a sufficient bonding property may not be obtained due to the insufficient curing, and if it is too much, then the heat-curing catalyst having high polarity moves to the bonding boundary side in the resin film forming layer under a high temperature high humidified condition, and the reliability of the semiconductor device declines due to the segregation.

(F) The Coupling Agent

The coupling agent (F) is used for improving the bonding property and the adhesive property against the chip of the resin film forming layer. Also, by using the coupling agent (F), the water resistance can be improved without interfering the heat resistance of the resin film obtained by curing the resin film forming layer.

As for the coupling agent (F), the compound comprising the group capable of reacting with the functional group comprised in the binder polymer component (A), and curable component (B). As for the coupling agent (F), silane coupling agent is preferable. As for such coupling agent, ?-glycidoxypropyltrimethoxy silane, ?-glycidoxypropylmethyldiethoxy silane, β-(3,4-epoxycyclohexyl)ethyltrimethoxy silane, ?-(methacryloxypropyl)trimethoxy silane, ?-aminopropyltrimethoxy silane, N-6-(aminoehtyl)-?-aminopropyltrimethoxy silane, N-6-(aminoethyl)-?-aminopropylmethyldiethoxy silane, N-phenyl-?-aminopropyltrimethoxy silane, ?-ureidepropyltriethoxy silane, ?-melcaptopropyltrimethoxy silane, ?-melcaptopropylmethyldimethoxy silane, bis(3-triethoxysilylpropyl)tetrasulphone, methyltrimethoxy silane, methyltriethoxy silane, vinyltrimethoxy silane, vinyltriacetoxy silane, imidazol silane or so may be mentioned. These may be used alone or by mixing two or more thereof.

The coupling agent (F) is included preferably by ratio of usually 0.1 to 20 parts by weight, preferably 0.2 to 10 parts by weight, and more preferably 0.3 to 5 parts by weight with respect to 100 parts by weight of the total of the binder polymer component (A) and the curable component (B). If the content of the coupling agent (F) is less thab 0.1 parts by weight, there is a chance that the above mentioned effect cannot be obtained, and if it exceeds 20 parts by weight, it may become a cause of generating the outgas.

(G) An Inorganic Filler

By blending the inorganic filler (G) in the resin film forming layer, it becomes possible to control the heat expansion coefficient at after the curing, thus the heat expansion coefficient of the resin film after the curing is optimized with respect to the semiconductor chip; thereby the reliability of the semiconductor device can be improved. Also, the moisture absorbing rate of the resin film after the curing can be reduced as well.

As for the preferable inorganic filler, powders such as silica, talc, calcium carbonate, titanium white, bengala, silicon carbide, boron nitride or so, a beads of which these has been made into spherical form, a single crystal fiber and glass fiber or so may be mentioned. Among these, silica filler is preferable. The above mentioned inorganic filler (G) may be used alone or by mixing two or more thereof. The content of the inorganic filler (G) is adjustable within the range of usually 1 to 80 parts by weight with respect to 100 parts by weight of the sntire solid portion constituting resin film forming layer.

(H) An Energy Ray Polymerizable Compound

In the resin film forming layer, the energy ray polymerizable compound may be blended. The energy ray polymerizable compound (H) includes an energy ray polymerizable group, and polymerizes and cures upon receiving the irradiation of the energy ray such as the ultra violet ray, the electron beam or so. As for specific examples of such energy ray polymerizable compound (H), an acrylate compound such as trimethylolpropanetriacrylate, pentaerythritoltriacrylate, pentaerythritoltetraacrylate, dipentaerythritolmonohydroxypentaacrylate, dipentaerythritolhexaacrylate or 1,4-butyleneglycoldiacrylate, 1,6-hexanedioldiacrylate, polyethyleneglycoldiacrylate, oligoesteracrylate, urethaneacrylate oligomer, epoxy modified acrylate, polyetheracrylate and itaconic acid oligomer or so may be mentioned. Such compounds comprise at least one polymerizable double bond in the molecule, and usually the weight average molecular weight is 100 to 30000, preferably 300 to 10000 or so. The blending amount of the energy ray polymerizable compound (H) is not particularly limited, however it is preferably used in the ratio of 1 to 50 parts by weight or so with respect to 100 parts by weight of entire solid portion constituting the resin film forming layer.

(I) A Photo-Polymerization Initiator

In case the resin film forming layer comprises the above mentioned energy ray polymerizable compound (H), upon using, the energy ray such as ultra violet ray or so is irradiated to cure the energy ray polymerizable compound. At this time, by comprising the photo-polymerization initiator (I) in said composition, the time for polymerizing and curing, and also the photo irradiation amount can be reduced.

As specific examples of such photo-polymerization initiator (I), benzophenone, acetophenone, benzoin, benzoinmethylether, benzoinethylether, benzoinisopropylether, benoinisobutylether, bennzoin benzoic acid, benzoin methyl benzoic acid, benzoindimethylketal, 2,4-diethylthioxanthone, a-hydroxycyclohexylphenylketone, benzyldiphenylsulphide, tetramethylthiurammonosulphide, azobisisobutyronitrile, benzil, dibenzil, diacetyl, 1,2-diphenylmethane, 2-hydroxy-2-methyl-1-[4-(1-methylvinyl)phenyl]propanone, 2,4,6-trimethylbenzoyldiphenylphosphineoxide, and β-chloranthraquinone or so may be mentioned. The photo-polymerization initiator (I) may be used alone or by combining two or more thereof.

The blending amount of the photo-polymerization initiator (I) is preferably 0.1 to 10 parts by weight, and more preferably 1 to 5 parts by weight with respect to 100 parts by weight of energy ray polymerizable compound (H). If it is less than 0.1 parts by weight, a sufficient transferring property may not be obtained due to the insufficient photo-polymerization, and if it exceed 10 parts by weight, the residues which do not contribute the photo-polymerization remains and the curing property of the resin film forming layer may be insufficient.

(J) A Thermoplastic Resin

The thermoplastic resin (J) may be included in the resin film forming layer. The thermoplastic resin (J) is blended in order to maintain the flexibility of the resin film after the curing. As for the thermoplastic resin (J), those having weight average molecular weight of 1000 to 100000 is preferable and more preferably 3000 to 80000. By comprising the thermoplastic resin (J) having the above range, the interlayer releasing between the release sheet and the resin film forming layer can be carried out easily during the transferring of the resin film forming layer to the chip or the semiconductor wafer; and further the resin film forming layer closely attaches at the transferring face and the void or so can be suppressed.

The glass transition temperature of the thermoplastic resin (J) is preferably −30 to 150° C., and more preferably −20 to 120° C. If the glass transition temperature of the thermoplastic resin (J) is too low, the releasing force between the resin film forming layer and the release sheet becomes too strong and the transfer failure of the resin film forming layer may happen; on the other hand, if it is too high, the bonding force between the chip and the resin film forming layer may become insufficient.

As for the thermoplastic resin (J), polyester resin, urethane resin, phenoxy resin, polybutene, polybutadiene, polystyrene or so may be mentioned. These may be used alone or by mixing two or more thereof.

The thermoplastic resin (J) is included in the ratio of usually 1 to 300 parts by weight, preferably 1 to 100 parts by weight with respect to 100 parts by weight of the total of the binder compound (A) and the curable component (B). When the content of the thermoplastic resin (J) is within this range, the above mentioned effects can be obtained.

(K) A Crosslinking Agent

The crosslinkling agent may be added in order to control the initial bonding force and the adhesion of the resin film forming layer. As for the crosslinking agent (K), organic polyvalent isocyanate, organic polyvalent imine compound or so may be mentioned.

As for the above mentioned organic polyvalent isocyanate, aromatic polyvalent isocyanate compound, aliphatic polyvalent isocyanate compound, alicyclic polyvalent isocyanate compound and the trimer of the organic polyvalent isocyanate compound thereof, and terminal isocyanateurethane prepolymer obtained by reacting these organic polyvalent isocyanate compounds and the polyol, may be mentioned.

As for the organic polyvalent isocyanate compound for example, 2,4-tolylenediisocyanate, 2,6-tolylenediisocyanate, 1,3-xylenediisocyanate, 1,4-xylenediisocyanate, diphenylmethane-4,4'-diisocyanate, diphenylmethane-2,4'-diisocyanate, 3-methyldiphenylmethanediisocyanate, hexamethylenediisocyanate, isophoronediisocyanate, dicyclohexylmethane-4,4'-diisocyanate, dicyclohexylmethane-2-4'-diisocyanate, trimethylolpropane adduct tolylenediisocyanate, and lysine isocyanate or so may be mentioned.

As for the above mentioned organic polyvalent imine compounds, N—N'-diphenylmethane-4,4'-bis(1-aziridinecarboxyamide), trimethylolpopane-tri-⊖-aziridinylpropionate, tetramethylolmethane-tri-β-aziridinylpropionate, and N,N'-toluene-2,4-bis(1-aziridinecarboxyamide)triethylenemelamine or so may be mentioned.

The crosslinking agent (K) is used in the ratio of usually 0.01 to 20 parts by weight, preferably 0.1 to 10 parts by weight, and more preferably 0.5 to 5 parts by weight with respect to 100 parts by weight of the binder polymer component (A).

(L) General-Purpose Additive Agents

Various additives may be blended depending on the needs into the resin film forming layer besides the above described. As for the various additives, a plasticizer, an antistatic agent, an antioxidizer or so may be mentioned.

The resin film forming layer formed from each component as described in the above has the bonding property and the heat curable property, and at the non-cured condition, it is easily bonded to the semiconductor wafer or chip or so by pressing. By going through the heat curing, at the end, a resin film having high impact resistance can be provided, and having superior bonding strength, further sufficient protection function can be maintained even under the harsh high temperature and high humidified condition.

Note that, the resin film forming layer can be a single layer structure, or it may be multilayer structure only if one or more layer having above mentioned component is included. Further, the resin film forming layer may have concentration gradient of the gettering agent (C) with respect to the thickness direction.

(The Resin Film Forming Sheet for Chip)

The resin film forming layer is obtained by coating and drying the resin film forming composition, on the release sheet, formed by mixing in a suitable solution comprising the above mentioned components in a suitable ratio. Also, the resin film forming composition may be coated on the carrier film different from the release sheet, then drying to form the resin film and it may be transferred to the release sheet.

The resin film forming sheet for chip according to the present invention is made by forming the above mentioned resin film forming layer on the release sheet in a releasable manner. The shape of the resin film forming sheet for chip according to the present invention can be various shapes such as tape shape, a label shape or so.

As for the release sheet, a transparent film may be used such as, polyethylene film, polypropyrene, film, polybutene film, polybutadiene film, polymehtylpentene film, polyvinyl chloride film, vinyl chloride copolymer film, polyethylene telephthalate film, polyethylene naphthalate film, polybutylenetelephthalate film, polyurethane film, ethylene vinyl acetate copolymer film, ionomer resin film, ethylene(meth) acrylic acid copolymer film, ethylene(meth)acrylate copolymer film, polystyrene film, polycarbonate film, polyimide film, fluorine resin film or so. Also, the crosslinked film thereof may be used as well. Further, it may be a laminated film thereof. Also, a colored film thereof, non-transparent film or so can be used as well.

In the resin film forming sheet for chip of the present invention, the release sheet is released upon using, and the resin film forming layer is transferred to the semiconductor wafer or the chip. Particularly, when releasing the release sheet after the heat curing of the resin film forming layer, as the release sheet needs to withstand the heat applying at the heat curing of the resin film forming layer, polyethylenetelephthalate film, polyethylene naphthalate film, polymethylpentene film, polyimide film or so which has superior heat resistance are preferably used. In order to make the releasing between the resin film forming layer and the release sheet easier, the surface tension of the release sheet is preferably 40 mN/m or less, more preferably 37 mN/m or less, and particularly preferably 35 mN/m or less. The lower limit is usually 25 mN/m or so. The substrate having such low surface tension can be obtained by selecting the suitably material, and also it can be obtained by carrying out the releasing treatment by coating the releasing agent on the surface of the substrate.

As for the releasing agent used for the releasing treatment, the releasing agent of alkyd type, silicone type, fluorine type, unsaturated polyester type, polyolefin type, wax type can be used; however the releasing agent of alkyd type, silicone type and fluorine type is preferably used as it has heat resistance.

In order to carry out the releasing treatment to the surface of the sheet using the above mentioned releasing agent, the releasing agent is used without the solvent, or by diluting in the solvent or by emulsifying, and coating by gravure coater, Meyer bar coater, air knife coater, or roll coater or so, then curing at room temperature, by applying the heat or by electron beam, further the laminated body can be formed by wet lamination or dried lamination, thermofusion lamination, melt extrusion lamination, coextrusion processing or so.

The thickness of the release sheet is usually 10 to 500 μm, preferably 15 to 300 μm, and particularly preferably 20 to 250 μm or so. Also, the thickness of the resin film forming layer is usually 1 to 500 μm, preferably 5 to 300 μm, and particularly preferably 10 to 150 μm or so.

Note that, before using the resin film forming sheet for chip, in order to protect the resin film forming layer, on the top face of the resin film forming layer, the releasing film which has easy releasing property may be laminated separately than said release sheet.

(The Production Method of the Semiconductor Chip)

The method of use of the resin film forming sheet for chip according to the present invention will be explained taking the case in which the sheet is applied in the production of the semiconductor chip.

The production method of the semiconductor chip according to the present invention is characterized by obtaining the semiconductor chip having the resin film on the back side by adhering the resin film forming layer of the above mentioned resin film forming sheet for chip on the back side of the semiconductor wafer of which the circuit is formed on the front surface. Said resin film is preferably the protection film of the semiconductor chip. Also, the production method of the semiconductor chip according to the present invention preferably includes the following steps of (1) to (3), and the steps (1) to (3) are carried out in arbitrary order.

Step (1): Releasing the resin film forming layer and the release sheet

Step (2): Curing the resin film forming layer

Step (3): Dicing the semiconductor wafer and the resin film forming layer.

The semiconductor wafer may be silicon wafer, and it may be a compound semiconductor wafer of gallium arsenic or so. The formation of the circuit to the wafer surface can be carried out by various methods including a conventionally widely used method such as etching method, liftoff method or so. Next, the opposite side (back side) of the circuit face of the semiconductor wafer is ground. The method of grinding is not particularly limited; and known means using grinder or so may be used for the grinding. At the back side grinding, in order to protect the circuit of the front surface, the adhesive sheet so called surface protection sheet is adhered to the circuit face. The back side grinding is carried out by fixing the circuit face side of the wafer using the chuck table or so, then the back side of which the circuit is not formed is ground by grinder. The thickness after the wafer grinding is not particularly limited, however usually it is 20 to 500 μm or so.

Then, depending on the needs, the fractured layer generated during the back side grinding is removed. The fractured layer is removed by a chemical etching, a plasma etching or so. By removing the fractured layer, the gettering function that the wafer had will decline; however by using the resin film forming layer of the present invention, the gettering function is provided to the obtained semiconductor device. Therefore, the production method of the semiconductor chip of the present invention can be suitably applied to the semiconductor wafer particularly to those which has removed the fractured layer. That is, the production method of the semiconductor chip of the present invention can be suitably applied to the semiconductor wafer wherein the thickness of the fractured layer is reduced to 50 nm or less, further to 30 nm or less, particularly to 10 nm or less.

Next, on to the back side of the semiconductor wafer, the resin film forming layer of the above mentioned resin film forming sheet for chip is adhered. Then, the steps (1) to (3) are carried out in arbitrary order. The detail of this process is described in Japanese Patent Application Laid Open No. 2002-280329. As for one example, the example of carrying out in the order of steps (1), (2), (3) will be explained.

First, to the back side of the semiconductor wafer formed with the circuit on the front surface, the resin film forming layer of the resin film forming sheet for chip is adhered. Then, the release sheet is removed from the resin film forming layer to obtain the laminated body having semiconductor wafer and the resin film forming layer. Next, the resin film forming layer is cured to form the resin film on the entire face of the wafer. In the resin film forming layer, the curable component (B) is included, thus generally the resin film forming layer is cured by the heat curing. Note that, in case the energy ray polymerizable compound (H) is blended in the resin film forming layer, the curing of the resin film forming layer can be carried out by both of the heat applying or the energy ray irradiation; and the curing by the heat applying and the energy ray irradiation may be carried out simultaneously or sequentially. As a result, the resin film formed of the curable resin is formed on the back side of the wafer, and the strength is improved compared to the wafer alone; thereby the breakage during the handling of the wafer made thinner can be reduced, and further the gettering function is provided due to the gettering agent (C) included in the resin film. Also, the evenness of the resin film is superior compared to the coating method wherein the coating solution for the resin film is directly coated to the back side of the wafer or the chip to form the film.

Next, the laminated body of the semiconductor wafer and the resin film is diced into each circuit formed on the wafer surface. The dicing is carried out so that the wafer and the resin film are both cut. The dicing of the wafer is carried out by usually method of using the dicing sheet. As a result, the semiconductor chip having the resin film on the back side is obtained.

Finally, by picking up the diced chip by usual method of collet or so, the semiconductor chip having the resin film on the back side is obtained. According to such the invention, the highly even resin film can be easily formed on the back side of the chip, and the cracks during the dicing step or after the packaging is less likely to happen. Further, as the gettering function is provided to the obtained semiconductor device, the migration is reduced even in the reflow environment. Further, by mounting the semiconductor chip on the predetermined substrate by a face-down manner, the semiconductor device can be produced. Also, the semiconductor device can be produced by bonding the semiconductor chip having the resin film on the back side to other members (on the chip mounting member) such as die pad portion or other semiconductor chip or so.

EXAMPLE

Hereinafter, the present invention will be described by referring to the examples; however the present invention is not to be limited thereto. Note that, in the examples and the comparative examples described in below, <the copper ion absorbing ability and the copper ion absorbing rate>, <the gettering function evaluation>, and <the weight decline starting temperature measurement> were carried out as described in the following.

<The Copper Ion Absorbing Ability and the Copper Ion Absorbing Rate>

1 g of the gettering agent prepared in the examples and the comparative examples were introduced in 50 g of the copper chloride aqueous solution having a copper ion concentration of 3 ppm which was prepared by dissolving 0.805 g of copper (II) chloride dihydrate made by KANTO CHEMICAL CO., INC. in 1 L of ultra pure water and further diluting into 100-fold solution; then it was left for 24 hours under 2 atmospheric pressure at 121° C. Then, it was filtered using a membrane filter having pore diameter of 0.10 μm. The remaining copper ion concentration of the copper ion solution of the filtrate was measured by atomic absorption spectrophotometry (measuring device: Atomic Absorption Spectrophotometer Z5310, flame method, made by Hitachi, Ltd), and the copper ion absorption ability and the copper ion absorbing rate were evaluated from the following formula using the initial ion concentration (3 ppm) and the remaining copper ion concentration (ppm).

The copper ion absorbing ability (%)=(3 ppm−the remaining copper ion concentration (ppm))× 100/3 ppm The copper ion absorbing rate (%)=(3 ppm−the remaining copper ion concentration (ppm))×solution amount (g)×10$^{-6}$×100/the sample weight (g)

<The Gettering Function Evaluation>

Using DGP8760 made by DISCO Corporation, the back side of the silicon wafer was carried out with the dry polish treatment (200 mm diameter, the thickness 75 μm, the fracture thickness 10 nm). To the face of the silicon wafer (the back side of the wafer) carried out with the dry polish treatment, 1 g of copper (II) chloride powder (made by KANTO CHEMICAL CO., INC., product name: copper (II) chloride dihydride) was evenly sprayed, and introduced into the pseudo-reflow condition (300° C., 30 minutes); thereby the copper ion was diffused in the silicon wafer. Then, the low adhesion tape (the post cured Adwill D-675 made by Lintec Corporation) was repeatedly adhered and released to remove the copper (II) chloride powder from the wafer back side.

Then, on to this silicon wafer back side contaminated with the copper ion, the resin film forming sheet for chip prepared in the examples and the comparative examples were adhered at 40° C. 30 minutes later, the ultra violet ray was irradiated (230 mW/cm$^2$, 120 mJ/cm$^2$) from the releasing film face using the ultraviolet ray irradiating device (Adwill RAD-2000 m/12 made by Lintec Corporation) to release the release sheet. Then, it was heat cured (140° C., 1 hour), and introduced under the pseudo-reflow condition (300° C., 30 min).

The wafer surface (the mirror face, the face without the resin film forming sheet for chip) was washed by hydrofluoric acid in advance to remove the contamination attached to the surface and the oxide layer (about 10 nm) naturally formed on the surface. Then, 10 mm of the wafer outer circumference was held by being sandwiched with the Teflon (registered Trademark) jigs so that the wafer outer circumference is masked by the Teflon; and 5 μm from the wafer surface was etched by nitric acid/hydrofluoric acid mixed solution (the ratio 3:1). The whole amount of the solution used for the etching was collected to the evaporating dish. After the collected etching solution is heated evaporated and exsiccation, the residue was dissolved in the predetermined mixed solution of the nitric acid/the hydrofluoric acid; thereby this was defined as the copper ion concentration measurement samples. Note that, the preparation of the samples was carried out in the clean draft (class 10) provided in the clean room (class 100).

The concentration of the copper ion in the silicon wafer was quantified by ICP-MS mearesument.

Device: ELAN6100DRC Plus made by ParkinElmer Inc.

Condition: Plasma power of 1500 W. The lower limit of the copper ion quantification is 3.0×10$^{12}$ atoms/cm$^3$ (the number of atoms per unit volume).

By measuring the copper ion concentration eluted from the etching solution, the gettering function of the resin film forming sheet for chip was evaluated. As the copper ion eluted out to the etching solution is less, more copper ion is captured by the resin film, and indicates the high gettering function. When the copper ion detection amount is 50×10$^{12}$ atoms/cm$^3$ or less it is considered good, and those exceeding 50×10$^{12}$ atoms/cm$^3$ was considered bad.

Note that, the quantification analysis method of the copper ion concentration may be carried out by the methods such as the atomic absorption spectrophotometry, ICP-OES, TOF-SIMS or so.

<The Mass Decline Starting Temperature Measurement>

The measurement of the mass decline starting temperature is carried out by using the differential thermal analyzer (TG/DTA analyzer DTG-60 made by Shimadzu Corporation). The organic chelate agent prepared in the examples and the comparative examples were used as the measuring samples, and about 10 mg of measuring sample was accurately scaled. The temperature of the measuring sample was raised to 40 to 500° C. at the temperature rising speed of 10° C./min, and the weight decline starting temperature was measured.

<The Resin Film Forming Layer Composition>

Each component constituting the resin film forming layer is shown in below.

(A) The binder polymer component: acrylic polymer (the weight average molecular weight: 900000, the glass transition temperature −28° C.) comprising 55 parts by weight of n-butylacrylate, 15 parts by weight of methyl acrylate, 20 parts by weight of glycidyl methacrylate, 15 parts by weight of 2-hydroxyethylacrylate (B) The curable component:

(B1) bisphenol A epoxy resin (epoxy equivalent of 180 to 200 g/eq)

(B2) dicyclopentadiene epoxy resin (EPICLON HP-7200HH made by DIC Corporation)

(B3) Heat curing agent: dicyandiamide (ADEKA hardener 3636AS made bay ADEKA CORPORATION).

(C) The gettering agent (C1-1) 3-(N-salicyloyl)amino-1,2,4-triazol (CDA-1, made by ADEKA CORPORATION, CAS No. 36411-52-6) (The copper ion absorbing ability 99.7%, the copper ion absorbing rate 0.015%, the particle diameter 1 μm)

[Chemical formula 4]

(C1-2) decamethylenedicarboxydisalicyloylhydrazide (CDA-6, made by ADEKA CORPORATION, CAS No. 63245-38-5) (the copper ion absorbing ability 95%, the copper ion absorbing rate 0.014%, the particle diameter 0.5 μm)

[Chemical formula 5]

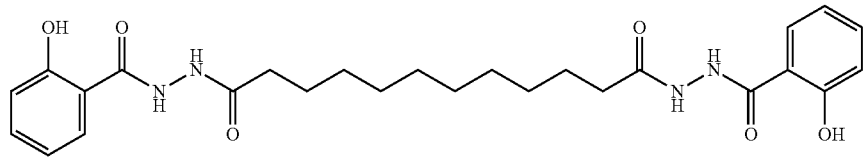

(C2) The organic chelate agent: the organic chelate agent comprising polyvalent carboxylic acid as the functional group (Tekuran Do, the acid value 260 to 330 mg/g, the weight decline strating temperature 200° C., made by Nagase ChemteX Corporation) (The copper ion absorbing ability 95.7%, the copper ion absorbing rate 0.014%, the particle diameter 1 μm)

(C3) KW-2200 made by Kyowa Chemical Industry Co., Ltd (hydrotalcite comprising the oxide of magnesium and aluminum) (the copper ion absorbing ability 99.8%, the copper ion absorbing rate 0.015%, the particle diameter of 1 μm)

(D) The coloring agent: Black pigment (carbon black, made by Mitsubishi Chemical Corporation, #MA650, the average diameter of 28 nm)

(E) The heat-curing catalyst: Imidazol (Curezol 2PHZ made by CHIKOKU CHEMICAL CORPORATION)

(F) The coupling agent: A-1110 (made by Nippon Unicar Company Limited)

(G) The inorganic filler: silica filler (molten silica filler, the average particle diameter 8 μm)

The Examples and the Comparative Examples

The above mentioned each component was blended in an amount shown in Table 1 to obtain the resin film forming layer composition. The methyl ethyl ketone solution (the solid concentration 61 wt %) of the obtained composition was coated on the releasing treated face of the release sheet (SP-PET3811 made by Lintec Corporation, the thickness 38 μm, the surface tension force 33 mN/m, the melting point 200° C. or higher) carried out with the releasing treatment with silicone so that the thickness after drying becomes 40 μm, then dried (the drying condition: 100° C. for 3 minutes in the oven); thereby the resin film forming layer is formed on the release sheet and obtained the resin film forming sheet for chip.

TABLE 1

|    | Example 1 | Example 2 | Example 3 | Example 4 | Example 5 | Example 6 | Example 7 | Comparative example 1 |
|----|-----------|-----------|-----------|-----------|-----------|-----------|-----------|----------------------|
| A  | 100       | 100       | 100       | 100       | 100       | 100       | 100       | 100                  |
| B1 | 50        | 50        | 50        | 50        | 50        | 50        | 50        | 50                   |
| B2 | 50        | 50        | 50        | 50        | 50        | 50        | 50        | 50                   |
| B3 | 2.8       | 2.8       | 2.8       | 2.8       | 2.8       | 2.8       | 2.8       | 2.8                  |
| C  | C1-1: 57.1 | C1-2: 57.1 | C2: 57.1 | C3: 57.1 | C3: 5.2  | C3: 129.0 | C3: 157.1 |                      |
| D  | 10        | 10        | 10        | 10        | 10        | 10        | 10        | 10                   |
| E  | 2.8       | 2.8       | 2.8       | 2.8       | 2.8       | 2.8       | 2.8       | 2.8                  |
| F  | 1         | 1         | 1         | 1         | 1         | 1         | 1         | 1                    |
| G  | 300       | 300       | 300       | 300       | 300       | 300       | 150       | 300                  |

Unit: parts by weight (in terms of solid portion)

By using the obtained resin film forming sheet for chip, <the copper ion absorbing ability and the copper ion absorbing rate> and <the gettering function evaluation> were carried out. The result and the content of the gettering agent with respect to 100 parts by weight of the above mentioned bonding agent composition is shown in Table 2.

TABLE 2

| | The gettering agent (the blending amount with respect to 100 parts by weight of the bonding agent composition) (parts by weight) | The copper ion absorbing ability (%) | The copper ion absorbing rate (%) | The gettering function ($\times 10^{12}$ atoms/cm$^3$) |
|---|---|---|---|---|
| Example | | | | |
| 1 | 10 | 99.7 | 0.015 | 9.5 |
| 2 | 10 | 95 | 0.014 | 15.3 |
| 3 | 10 | 95.7 | 0.014 | 14.2 |
| 4 | 10 | 99.8 | 0.015 | 8.4 |
| 5 | 1 | 99.8 | 0.015 | 40.5 |
| 6 | 20 | 99.8 | 0.015 | 4.5 |
| 7 | 30 | 99.8 | 0.015 | N.D. |
| Comparative example 1 | none | — | — | 80 |
| Reference example | — | — | — | N.D. |
| 1 | | | | |
| 2 | — | — | — | 80 |

Note that, the gettering function of the wafer without the copper ion contamination (the reference example 1) and the wafer without adhereing the resin film forming sheet but carried out with the copper ion contamination (the reference example 2) were measured.

The resin film forming sheet for chip of the examples exhibited excellent copper ion absorbing ability, copper ion absorbing rate, and the gettering function. From these results, it was confirmed that by using the gettering agent (C) in the resin film forming layer, the semiconductor chip with high reliability can be obtained.

The invention claimed is:

1. A resin film forming sheet for chip comprising:
a release sheet and a resin film forming layer formed on a releasing face of said release sheet, and said resin film forming layer includes a binder polymer component, a curable component and a gettering agent,
wherein the gettering agent is selected from a group consisting of a heavy metal inactivator and a copper ion capture metal compound.

2. The resin film forming sheet for chip as set forth in claim 1 wherein a copper ion absorbing ability of the gettering agent as defined below is 30% or more:
introducing 1 g of the gettering agent into 50 g of copper chloride aqueous solution having a copper ion concentration of 3 ppm, then measuring the copper ion concentration of said copper ion solution after being left for 24 hours under 2 atmospheric pressure at 121° C. to obtain the copper ion absorbing ability by, copper ion absorbing ability=(3 ppm−remaining copper ion concentration (ppm))×100/3 ppm.

3. The resin film forming sheet for chip as set forth in claim 1, wherein said resin film forming layer further includes a coloring agent.

4. The resin film forming sheet for chip as set forth in claim 1, wherein 1 to 35 parts by weight of the gettering agent is included per 100 parts by weight of an entire solid portion constituting the resin film forming layer.

5. The resin film forming sheet for chip as set forth in claim 1, wherein the resin film forming layer is a protection film for a semiconductor wafer or chip.

6. A production method of a semiconductor chip, comprising obtaining a semiconductor chip comprising a resin film on a back side by adhering the resin film forming layer of the resin film forming sheet for chip as set forth in claim 1 to the back side of a semiconductor wafer formed with a circuit on a front surface.

7. The production method of the semiconductor chip as set forth in claim 6 further comprising:
removing the release sheet;
curing the resin film forming layer; and
dicing the semiconductor wafer and the resin film forming layer.

8. The production method of the semiconductor chip as set forth in claim 6, wherein the semiconductor wafer has a fractured layer caused by the back side grinding being reduced to the thickness of 50 nm or less.

9. The production method of the semiconductor chip as set forth in claim 6, wherein the resin film comprises a protection film of the semiconductor chip.

10. A resin film forming sheet for chip, comprising:
a release sheet and a resin film forming layer formed on a releasing face of said release sheet, and said resin film forming layer includes a binder polymer component, a curable component and a gettering agent,
wherein the gettering agent is an organic chelate agent, and
wherein a copper ion absorbing ability of the gettering agent as defined below is 30% or more:
introducing 1 g of the gettering agent into 50 g of copper chloride aqueous solution having a copper ion concentration of 3 ppm, then measuring the copper ion concentration of said copper ion solution after being left for 24 hours under 2 atmospheric pressure at 121° C. to obtain the copper ion absorbing ability by, copper ion absorbing ability=(3 ppm−remaining copper ion concentration (ppm))×100/3 ppm.

* * * * *